United States Patent
Jeong et al.

(10) Patent No.: US 8,659,714 B2
(45) Date of Patent: Feb. 25, 2014

(54) LIGHT EMITTING DEVICE

(75) Inventors: Hwan Hee Jeong, Seoul (KR); Sang Youl Lee, Seoul (KR); Kwang Ki Choi, Seoul (KR); June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 196 days.

(21) Appl. No.: 13/219,860

(22) Filed: Aug. 29, 2011

(65) Prior Publication Data

US 2012/0050644 A1 Mar. 1, 2012

(30) Foreign Application Priority Data

Aug. 30, 2010 (KR) .................. 10-2010-0084055

(51) Int. Cl.
*G02F 1/136* (2006.01)
(52) U.S. Cl.
USPC ........................................... 349/43
(58) Field of Classification Search
USPC ..................................... 349/42–43
See application file for complete search history.

(56) References Cited

U.S. PATENT DOCUMENTS

2009/0278161 A1  11/2009  Lee et al. ................. 257/99

FOREIGN PATENT DOCUMENTS

| JP | 2004-0172189 A | 6/2004 |
| KR | 10-0294345 B1 | 7/2001 |
| KR | 10-2007-0020674 A | 2/2007 |
| KR | 10-2007-0027327 A | 3/2007 |
| KR | 10-0737821 B1 | 7/2007 |

*Primary Examiner* — Phu Vu
(74) *Attorney, Agent, or Firm* — Ked & Associates, LLP

(57) ABSTRACT

A light emitting device includes a light emitting structure comprising a first conductivity type semiconductor layer, an active layer and a second conductivity type semiconductor layer; a first ohmic layer and a first electrode provided on the first conductivity type semiconductor layer; and a second electrode provided on the second conductivity type semiconductor layer, wherein a contact area between the first conductivity type semiconductor layer and the first ohmic layer comprises oxygen at 5% or more of an atomic ratio or nitrogen at 50% or more of an atomic ratio.

20 Claims, 7 Drawing Sheets

Laser

LIGHT EMITTING DEVICE

CROSS REFERENCE TO RELATED APPLICATION

This application claims the benefit of the Patent Korean Application No. 10-2010-0084055, filed on Aug. 30, 2010, which is hereby incorporated by reference as if fully set forth herein.

BACKGROUND OF THE DISCLOSURE

1. Field of the Disclosure

The embodiment relates to a light emitting device.

2. Discussion of the Related Art

Owing to development of thin film growth and thin film device elements, a light emitting device including a light emitting diode and a laser diode, which use 3-5 group or 2-6 group compound semiconductor elements of a semiconductor, can present a variety of colors, for example, red, green and blue colors and an infrared ray. Fluorescence material usage or color combination allows the light emitting device to present a white light having good light efficiency. Compared with a conventional light source such as a fluorescent lamp and an incandescent lamp, such the light emitting device has several advantages of low power consumption, semipermanent usage, fast response speed, safety and environment-friendliness.

As a result, the light emitting device has been applied to a transmission module of light communication means, a light emitting diode backlight replacing a cold cathode fluorescence lamp (CCFL) composing a backlight of a liquid crystal display (LCD) device, a white light emitting diode lightening device replacing a fluorescent lamp and an incandescent lamp, a headlight of a vehicle and even to a traffic light broadly.

SUMMARY OF THE DISCLOSURE

Accordingly, embodiments are directed to a light emitting. An object of the embodiments is to improve an ohmic characteristic of a light emitting device.

Additional advantages, objects, and features of the disclosure will be set forth in part in the description which follows and in part will become apparent to those having ordinary skill in the art upon examination of the following or may be learned from the embodiment. The objectives and other advantages of the embodiment may be realized and attained by the structure particularly pointed out in the written description and claims hereof as well as the appended drawings. To achieve these objects and other advantages and in accordance with the purpose of the embodiment, as embodied and broadly described herein, a light emitting device includes a light emitting structure comprising a first conductivity type semiconductor layer, an active layer and a second conductivity type semiconductor layer; a first ohmic layer and a first electrode provided on the first conductivity type semiconductor layer; and a second electrode provided on the second conductivity type semiconductor layer, wherein a contact area between the first conductivity type semiconductor layer and the first ohmic layer comprises oxygen at 5% or more of an atomic ratio or nitrogen at 50% or more of an atomic ratio.

Here, the contact area of the first conductivity type semiconductor layer may be plasma-treated in an oxygen or nitrogen atmosphere.

The first ohmic layer may be formed of at least one material selected from a group consisted of Ti, Cr, Al, V or W.

Also, the thickness of the first ohmic layer may be 0.5 nanometer to 3.0 micrometers.

In another aspect of the embodiments, a method of manufacturing a light emitting device comprising steps of growing a light emitting structure on a substrate, the light emitting structure comprising a first conductivity type semiconductor layer, an active layer and a second conductivity type semiconductor layer; forming a second electrode on the second conductivity type semiconductor layer; removing the substrate and supplying oxygen or nitrogen to a surface of the first conductivity type semiconductor layer; and forming an ohmic layer and a first electrode on the first conductivity type semiconductor layer.

Here, the oxygen or nitrogen supplying may be performed according to a plasma treating method.

The plasma treating may be performed according to one of Reactive Ion Etching (RIE), Inductively Coupled Plasma (ICP) and Sputtering.

Also, the oxygen or nitrogen supplying may be performed according to an implanting method.

Therefore, the light emitting device according to the embodiment may enhance an ohmic characteristic.

It is to be understood that both the foregoing general description and the following detailed description of the embodiment are exemplary and explanatory and are intended to provide further explanation of the embodiment as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

In the drawings.

DESCRIPTION OF SPECIFIC EMBODIMENTS

Figure 1A:
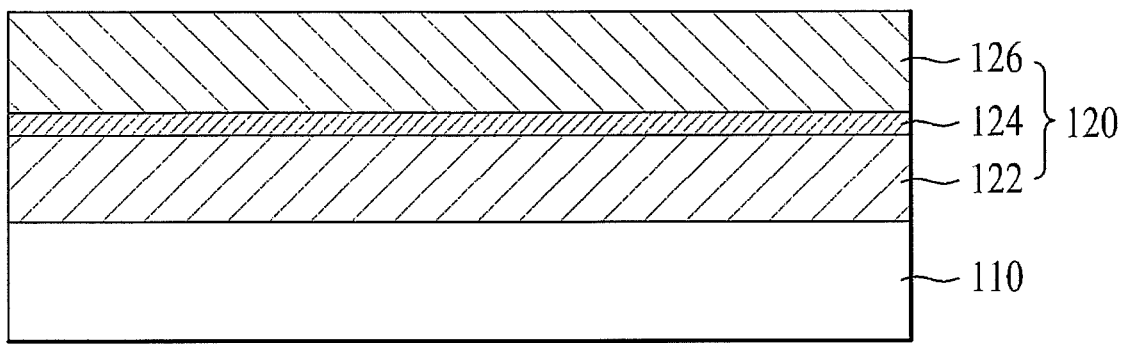
FIGS. 1a through 1i are diagrams illustrating a method of manufacturing a light emitting device according to an embodiment.

As follows, exemplary embodiments of the embodiment will be described in reference to the accompanying drawings.

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

The thickness and size of each layer may be exaggerated, emitted or illustrated schematically in the drawings, for explanation and precision. The size of each component shown in the drawings may not reflect the actual size completely.

FIGS. 1a through 1i are diagrams illustrating a method of manufacturing a light emitting device according to a first embodiment.

As shown in FIG. 1a, a substrate 110 is prepared and the substrate 110 includes a conductive substrate or an insulative substrate. For example, the substrate 110 may include at least one of sapphire ($Al_2O_3$), SiC, Si, GaAs, GaN, ZnO, Si, GaP, InP, Ge and $Ga_2O_3$. An uneven structure may be formed on the substrate 110 and the embodiment is not limited thereto. Wet cleaning may be performed to the substrate 110 and impurities may be eliminated from a surface of the substrate 110.

On the substrate 110 may be formed a light emitting structure 120 including a first conductivity type semiconductor layer 122, an active layer 124 and a second conductivity type semiconductor layer 126.

At this time, a buffer layer (not shown) may grow between the light emitting structure 120 and the substrate 110, reduce lattice mismatch of materials and a difference of coefficients of thermal expansion. The buffer layer may be formed of a 3-5 group compound semiconductor, for example, at least one of GaN, InN, AlN, InGaN, AlGaN, InAlGaN and AlInN. An undoped layer may be formed on the buffer layer and the embodiment is not limited thereto.

Also, the light emitting structure 120 may grow according to vapor deposition such as metal organic chemical vapor deposition (MOCVD), molecular beam epitaxy (MBE) or hydride vapor phase epitaxy (HVPE).

The first conductivity type semiconductor layer 122 may be realized by a 3-5 group compound semiconductor having a first conductivity type dopant doped thereon. In case the first conductivity type semiconductor layer 122 is an N-type semiconductor layer, the first conductivity type dopant may include Si, Ge, Sn and Te as N-type dopant and the embodiment is not limited thereto.

The first conductivity type semiconductor layer 122 may include a semiconductor material having an empirical formula: $Al_xIn_yGa_{(1-x-y)}N$ ($0 \leq x \geq 1$, $0 \leq y \leq 1$, $0 \leq x+y \leq 1$). The first conductivity type semiconductor 122 may be formed of one or more of GaN, InN, AlN, InGaN, AlGaN, InAlGaN, AlInN, AlGaAs, InGaAs, AlInGaAs, GaP, AlGaP, InGaP, AlInGaP or InP.

An N-type GaN layer may be formed on the first conductivity type semiconductor layer 122 by using CVD, MBE, sputtering or HVPE. Also, the first conductivity type semiconductor layer 122 may be formed by injecting into a chamber silane gas ($SiH_4$) including N-type impurities such as TMGa, $NH_3$, $N_2$ and Si.

The active layer 124 is a layer configured to emit a light having a predetermined energy determined by an unique energy band of a material forming an active layer (light emitting layer), after an electron injected via the first conductivity type semiconductor layer 122 meets a hole injected via the second conductivity type semiconductor layer 126 which is formed later.

The active layer 124 may be formed in at least one of Single Quantum Well structure, Multi Quantum Well (MQW) structure, Quantum-Wire structure and Quantum Dot structure. For example, trimethylgallium gas (TMGa), ammonia gas ($NH_3$), nitrogen gas ($N_2$) and trimethylindium gas (TMIn) are injected to form the active layer 130 in MQW structure, and the embodiment is not limited thereto.

A well layer/barrier layer structure of the active layer 130 may be formed of a pair of or more pairs of InGaN/GaN, InGaN/InGaN, GaN/AlGaN, InAlGaN/GaN, GaAs(InGaAs)/AlGaAs, GaP(InGaP)/AlGaP and the embodiment is not limited thereto. The well layer may be formed of material with a predetermined band gap that is lower than a band gap of the barrier layer.

A conductivity type clad layer (not shown) may be formed on and/or under the active layer 124. The conductivity type clad layer may be formed of AlGaN-based material and it may have a higher band gap than the band gap of the active layer 124.

The second conductivity type semiconductor layer 126 may include a 3-5 group compound semiconductor having a second conductivity type dopant doped thereon, for example, a semiconductor material having a following empirical formula: $In_xAl_yGa_{1-x-y}N$ ($0 \leq x \leq 1$, $0 \leq y \leq 1$, $0 \leq x+y \leq 1$). When the second conductivity type semiconductor layer 126 is a p-type semiconductor layer, the second conductivity type dopant may include Mg, Zn, Ca, Sr and Ba as p-type dopant.

On the second conductivity type semiconductor 126 may be formed a P-type GaN layer by injecting bisethylcyclopentadienyl magnesium ($EtCp_2Mg$){$(Mg(Cp_2H_5C_5H_4)_2)$} having p-type impurity such as trimethyl gallium gas (TMGa), ammonia gas ($NH_3$), nitrogen gas ($N_2$) and magnesium (Mg) into a chamber, and the embodiment is not limited thereto.

This embodiment may present that the first conductivity type semiconductor layer 122 is a p-type semiconductor layer and that the second conductivity type semiconductor type layer 126 is an n-type semiconductor layer. On the second conductivity type semiconductor layer 126 may be formed a semiconductor having an opposite polarity to a polarity of the second conductivity type, for example, an n-type semiconductor layer (not shown) when the second conductivity type semiconductor layer is a p-type semiconductor layer. Because of that, the light emitting structure 110 may be realized in one of N—P, N—P—N and P—N—P junction structures.

Figure 1B:
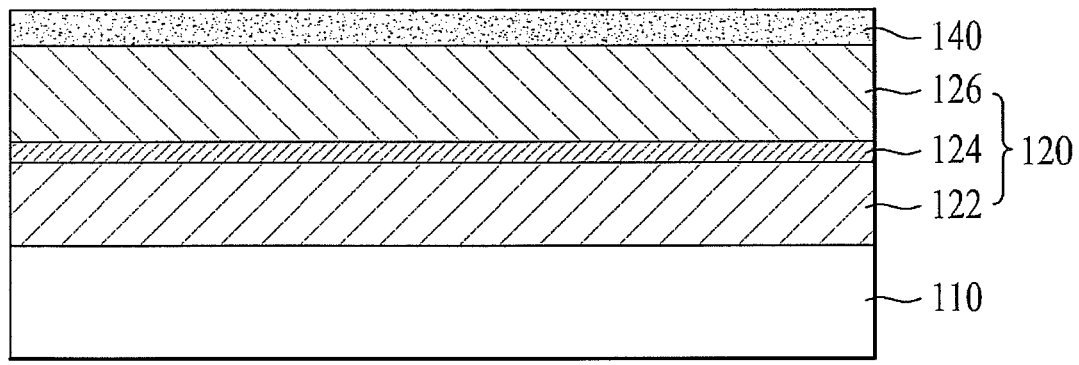

As shown in FIG. 1b, a second ohmic layer 140 is layered on the second conductivity type semiconductor layer 126, with a thickness of approximately 200 angstroms.

The second ohmic layer 140 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au and Hf and the second ohmic layer of the embodiment is not limited to these materials. The second ohmic layer 140 may be formed according to sputtering or electron beam vapor deposition.

Figure 1C:
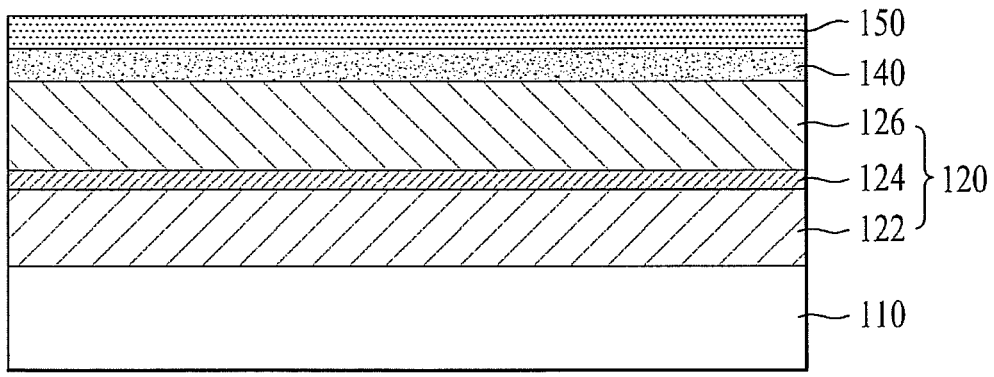

As shown in FIG. 1c, a reflective layer 150 is formed on the second ohmic layer 140, with a thickness of approximately 2500 angstroms. The reflective layer 145 may be a metal layer including an alloy of Al, Ag, Pt and R or alloy of Al, Ag, Ni, Pt or Rh. Aluminum or silver can reflect the light generated from the active layer 124 effectively, to improve light extraction efficiency of the light emitting device remarkably.

Figure 1D:
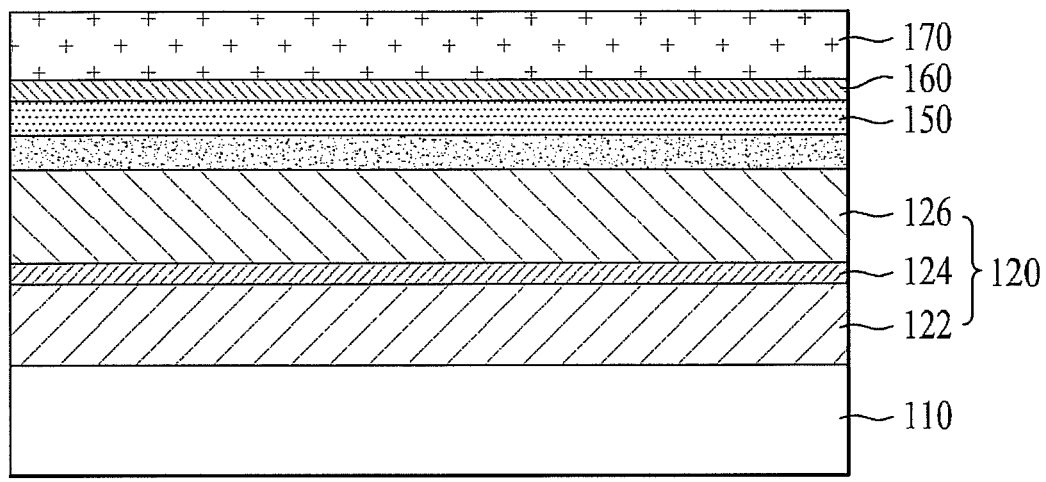

As shown in FIG. 1d, a conductive supporting substrate 170 may be formed on the reflective layer 150.

The conductive supporting substrate 170 may be formed of a material selected from a group composed of Mo, Si, W, Cu and Al or an alloy of the group. The conductive supporting substrate 170 may include Au, Cu Alloy, Ni, Cu—W and a carrier wafer (for example, GaN, Si, Ge, GaAs, ZnO, SiGe, SiC, SiGe and $Ga_2O_3$) selectively. A method of forming the conductive supporting substrate 170 may be electrochemical metal deposition or eutectic metal bonding.

Here, to adhere the reflection layer 150 and the conductive supporting substrate 170 to each other, an adhesion layer 160 may be formed of at least one material selected from a group consisted of Au, Sn, In, Al, Si, Ag, Ni, Cu or an alloy of the group, or the reflective layer 150 may be employed as adhesive layer. The second ohmic layer 140, the reflective layer 150 and the conductive supporting substrate 170 may be employed as second electrode.

Figure 1E:
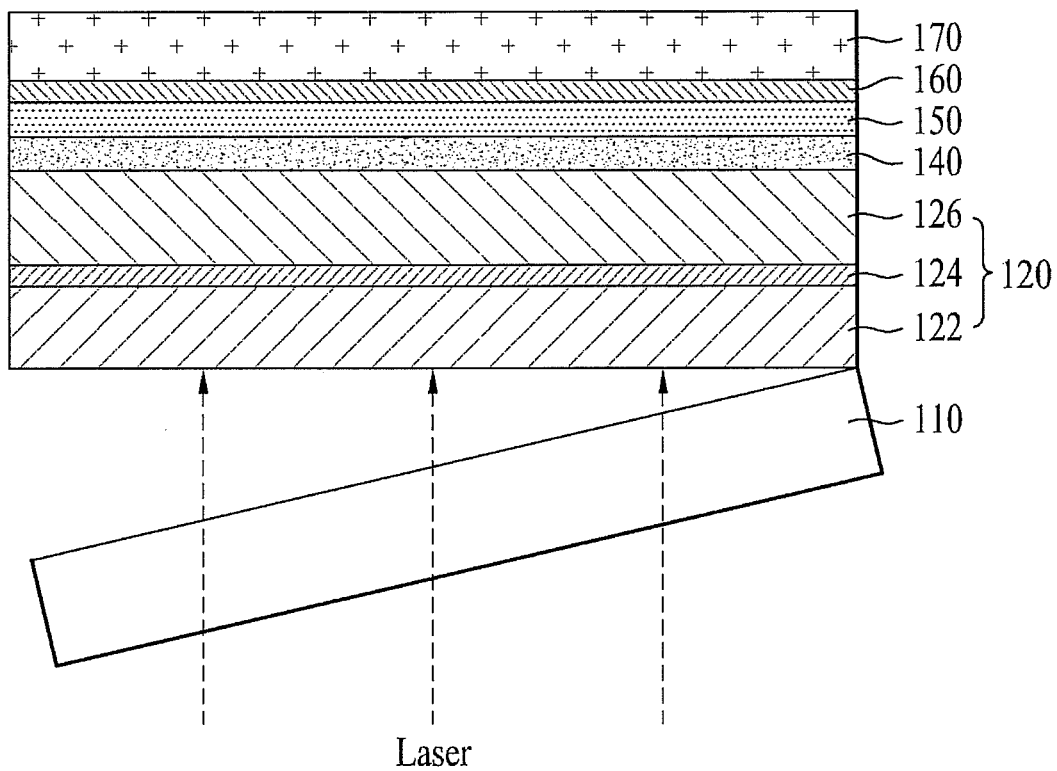

Hence, the substrate 110 is detached as shown in FIG. 1e.

The substrate 110 may be detached according to Laser Lift Off (LLO) which uses an excimer layer or dry and wet etching.

In case of Laser Lift Off (LLO), an excimer layer having a predetermine wavelength is focused and irradiated toward the substrate 110. After that, a thermal energy is concentrated on a boundary surface between the substrate 110 and the light emitting structure 120 such that the boundary surface is divided into gallium particles and nitrogen particles to detach the substrate 110 at an area passing the laser thereon in a moment.

Figure 1F:
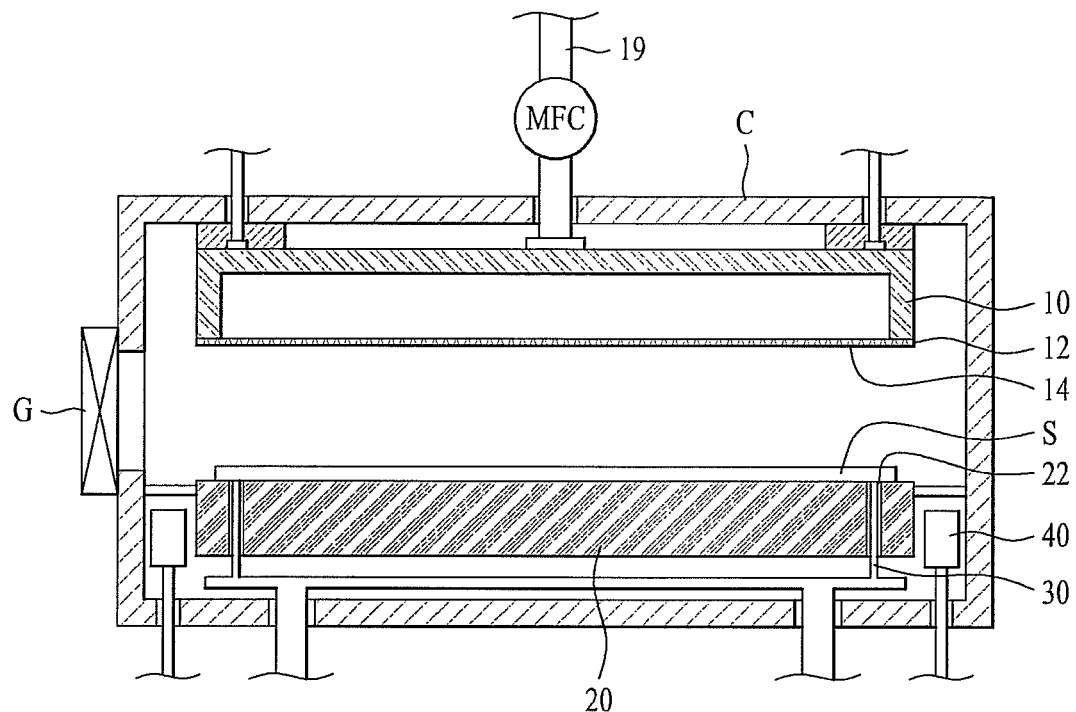

As shown in FIG. 1f, a surface of the first conductivity type semiconductor layer 122 is plasma-treated. At this time, the plasma treatment may be performed according to one of inductively coupled plasma (ICP), reactive ion etching (RIE) and sputtering.

The plasma treatment will be described in detail as follows.

As shown in the drawing, two electrodes 10 and 20 opposed to each other vertically in parallel are prepared. A light emitting device (S) is mounted on a lower one 20 of the two electrodes. Here, the light emitting device (S) is the light emitting device having the substrate lift process of FIG. 1e being completed. Only the surface of the first conductivity type semiconductor layer 122 is plasma-treated and the other parts may be covered by a mask and the like.

A plasma treatment device includes an inner lift pin 30 and an outer lift bar 40 which perform processes of transferring a substrate inward and outward, respectively. The inner lift pin 30 is formed passing through an edge are of the lower electrode 20 to drive vertically passing a through hole 22 formed in the lower electrode 20.

The outer lift bar (not shown) is provided outer to the lower electrode independently and it is provided in a space formed between a lateral side of the lower electrode 20 and a lateral wall of the plasma treatment device, to drive vertically.

The upper electrode 10 is located in opposite to the lower electrode 20 and it is employed not only as electrode but also processing gas supplier to inject processing gas between both the electrodes. Because of that, a shower head 12 is coupled to a bottom of the upper electrode 10 as shown in the drawing.

A plurality of spread holes 14 each of which has a minute diameter may be formed in the shower head 12 such that the processing gas may be spread in the space formed between the electrodes 10 and 20 uniformly.

Oxygen ($O_2$), nitrogen ($O_3$) or argon (Ar) may be supplied to the space between the electrodes as processing gas in the plasma treating process. Once a high frequency electric power is applied to the electrodes, the gas mentioned above is varied into plasma to treat the surface of the substrate (S).

An exhaustion part (not shown) is provided in the plasma treatment device to exhaust internal gas. The exhaustion part sucks to remove internal gas of the plasma treatment device by using a pump (not shown) provided outside the plasma treatment device, to maintain the inside of the plasma treatment device in a vacuum.

Plasma treatment is performed in an oxygen atmosphere, for example, in the plasma treating process, GaN of the first conductivity type semiconductor layer 122 is active with oxygen to form $Ga_2O_3$. After that, N-vacancy is formed on the surface of the first conductivity type semiconductor layer 122 and drop down of a work function may be generated.

Figure 1G:
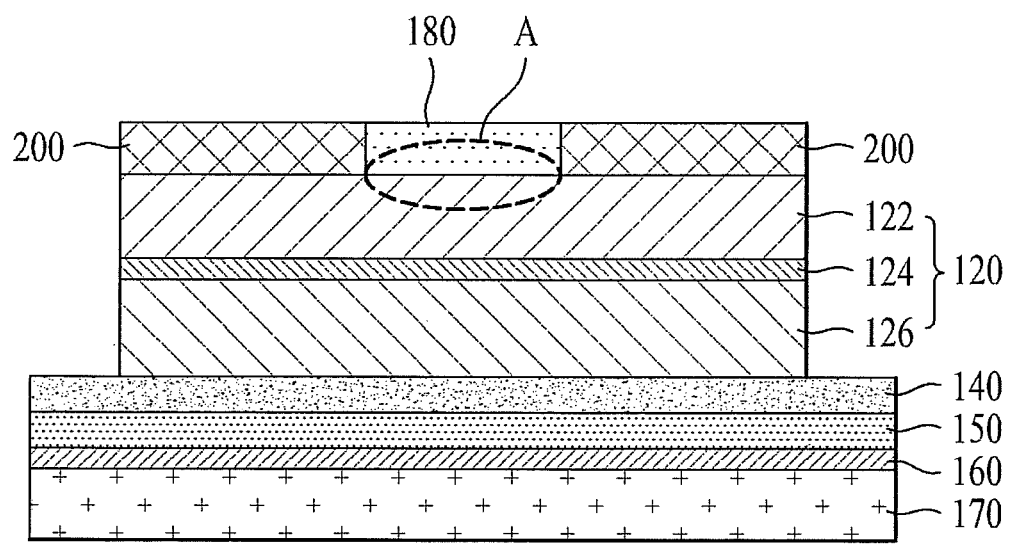
Figure 1H:
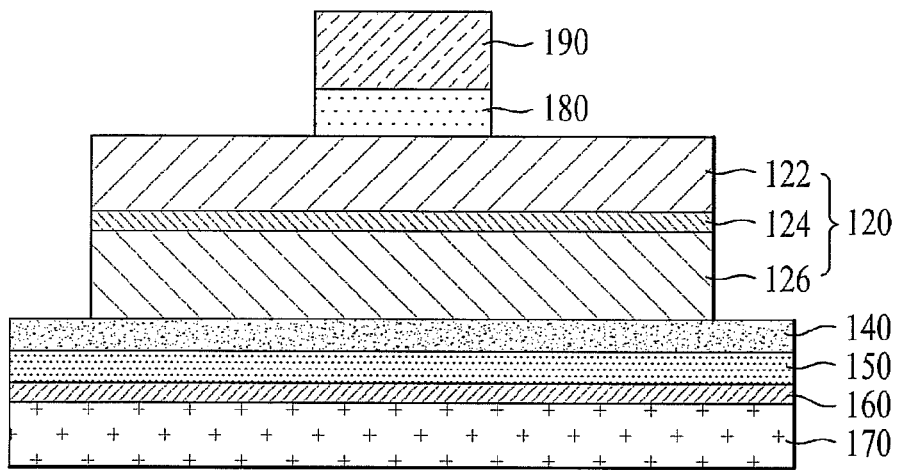

As shown in FIG. 1g, a mask 200 is covered on the plasma-treated surface of the first conductivity type semiconductor layer 122 and a first ohmic layer 180 is formed. The first ohmic layer 180 may be formed by depositing a material selected from a group composed of Ti, Cr, Al, V and W or an alloy of the group according to sputtering or electron beam vapor deposition. The first ohmic layer 180 may have a thickness of 0.5 to 3.0 micrometers.

The composition elements of the first ohmic layer 180, especially, vanadium and tungsten may keep a stable state in a thermal treatment process, which will be described later, compared with the other metals, and also they have no property degradation generated by a high temperature even when driven at a high power.

When the first ohmic layer 180 is formed with a thickness of 0.5 nanometer or less, an effect of lowering an operation voltage of the device may not work sufficiently.

After depositing the first ohmic layer 180, a post-annealing process is performed at a temperature of approximately 350 degrees (° C.) or less and a contact characteristic of the first ohmic layer 180 may be then maintained.

At this time, a contact area (A) between the first conductivity type semiconductor layer 122 and the first ohmic layer 180 may have 5% oxygen (O) or more of an atomic ratio or 50% nitrogen (N) or more of an atomic ratio, which is a trace of the plasma treatment. In other words, the surface of the first conductivity type semiconductor layer 122 after the substrate detach process includes approximately 60% gallium (Ga) or more of an atomic ratio, approximately 30% nitrogen (N) or more of an atomic ratio, approximately 2~3% oxygen (O) of an atomic ratio and the other elements such as carbon (C), typically. Oxygen or nitrogen is provided in the plasma treatment process and the quantity mentioned above may remain.

In addition, the supply of the oxygen or nitrogen may be performed by an implanting method. At this time, an implant process may be performed on an entire area of the surface of the first conductivity type semiconductor layer 122. however, to make open only an area where the first ohmic layer 180 will be formed, a photoresist pattern is formed in photographing and developing processes and the oxygen or nitrogen implanting process is performed after that, to form an oxygen layer or a nitrogen layer with a predetermined thickness at the area where the first ohmic layer 180 will be formed.

As shown in FIG. 1f, a first electrode is formed on the first ohmic layer 180. The first electrode 190 is formed of one of molybdenum, chromium (Cr), nickel (Ni), gold (Au), aluminum (Al), titanium (Ti), platinum (Pt), vanadium (V), tungsten (W), lead (Pd), copper (Cu), rhodium (Rh) and iridium (Ir) or an alloy of these metals. The first electrode 190 may be also formed by using a mask to be provided on the first conductivity type semiconductor layer 122

Figure 1I:
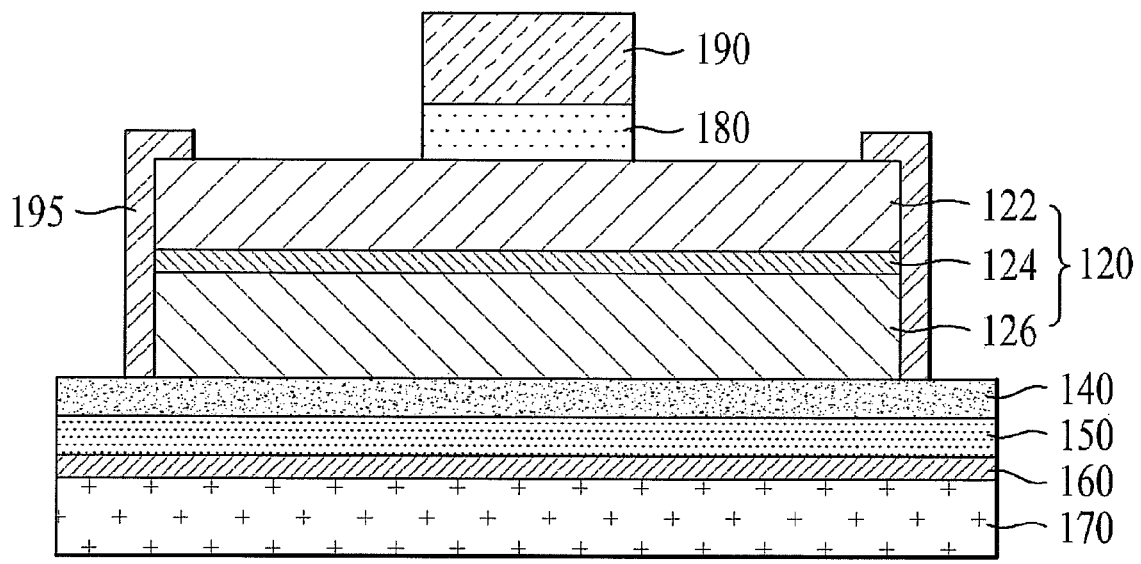

As shown in FIG. 1i, a passivation layer 195 may be deposited on a lateral side of the light emitting structure 120. Here, the passivation layer 195 may be formed of an insulative material and the insulative material may be an oxide or a nitride which is non-conductive. For example, the passivation layer 195 may be composed of a silicon oxide layer ($SiO_2$) layer, an oxynitride layer and an aluminum oxide layer.

Figure 2:
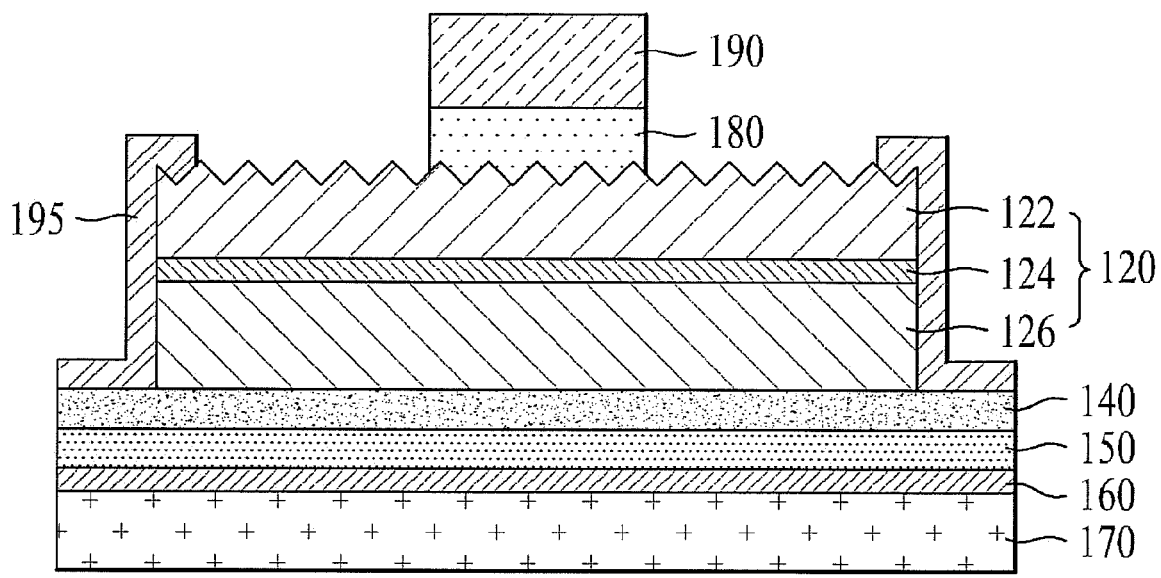
FIG. 2 is a diagram illustrating a light emitting device according to another embodiment.

FIG. 2 is a diagram illustrating a light emitting device according to another embodiment.

This embodiment is identical to the embodiment shown in FIG. 1i, except an uneven shape provided in a surface of the first conductivity type semiconductor layer 122. The uneven shape may be formed by PEC or etching after forming a mask. Here, the quantity of etching liquid (for example, KOH), the intensity and the exposure time of UV, a difference between etching velocities of Gallium-polar and Nitrogen-polar and a difference between etching velocities based on GaN crystallinity may be controlled. Because of that, the shape of the unevenness with a microsize may be controlled.

According to the etching process which uses the mask, a photoresist is coated on the first conductivity type semiconductor layer 122 and a lithography process is performed by using a mask after that. When the lithography process is performed, the process is developed and an etching pattern is formed. According to the process mentioned above, the etching pattern is formed on the first conductivity type semiconductor layer 122. While the etching process is performed, the uneven structure is formed on the first conductivity type semiconductor layer 122. The uneven structure is configured to increase a surface area of the first conductivity type semiconductor layer 122. As the number of crests and troughs is larger, it is more preferable.

The light emitting device according to the embodiments has the surface of the first conductivity type semiconductor layer which is plasma-treated by using oxygen and the like. Because of that, the work function of the surface could drop down and the ohmic characteristic may be enhanced such that a relatively high current may flow at a low voltage. As a result, an operation voltage of the light emitting device may be lowered.

Figure 3:
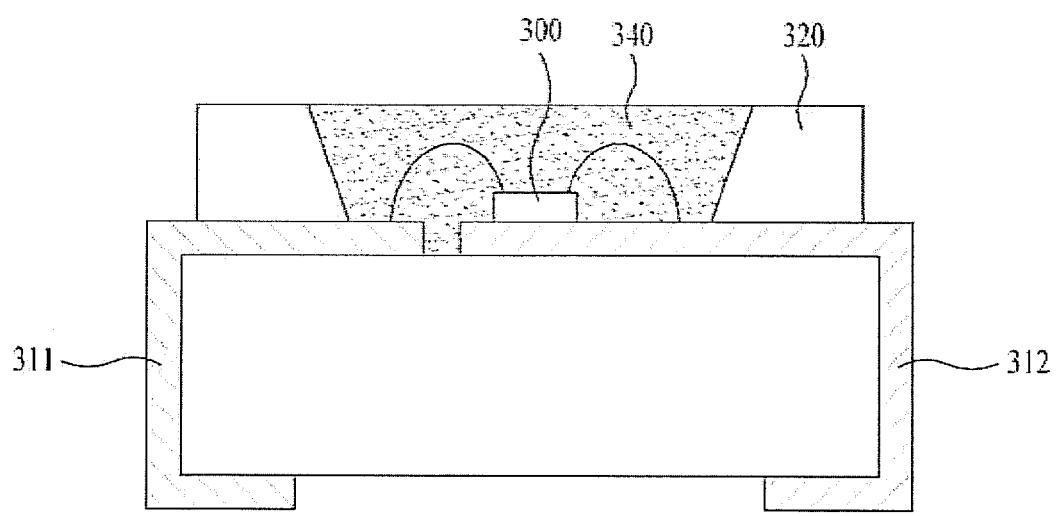
FIG. 3 is a diagram illustrating a light emitting device package according to an embodiment.

FIG. 3 is a sectional view illustrating a light emitting device package according to an embodiment.

Figure 4:
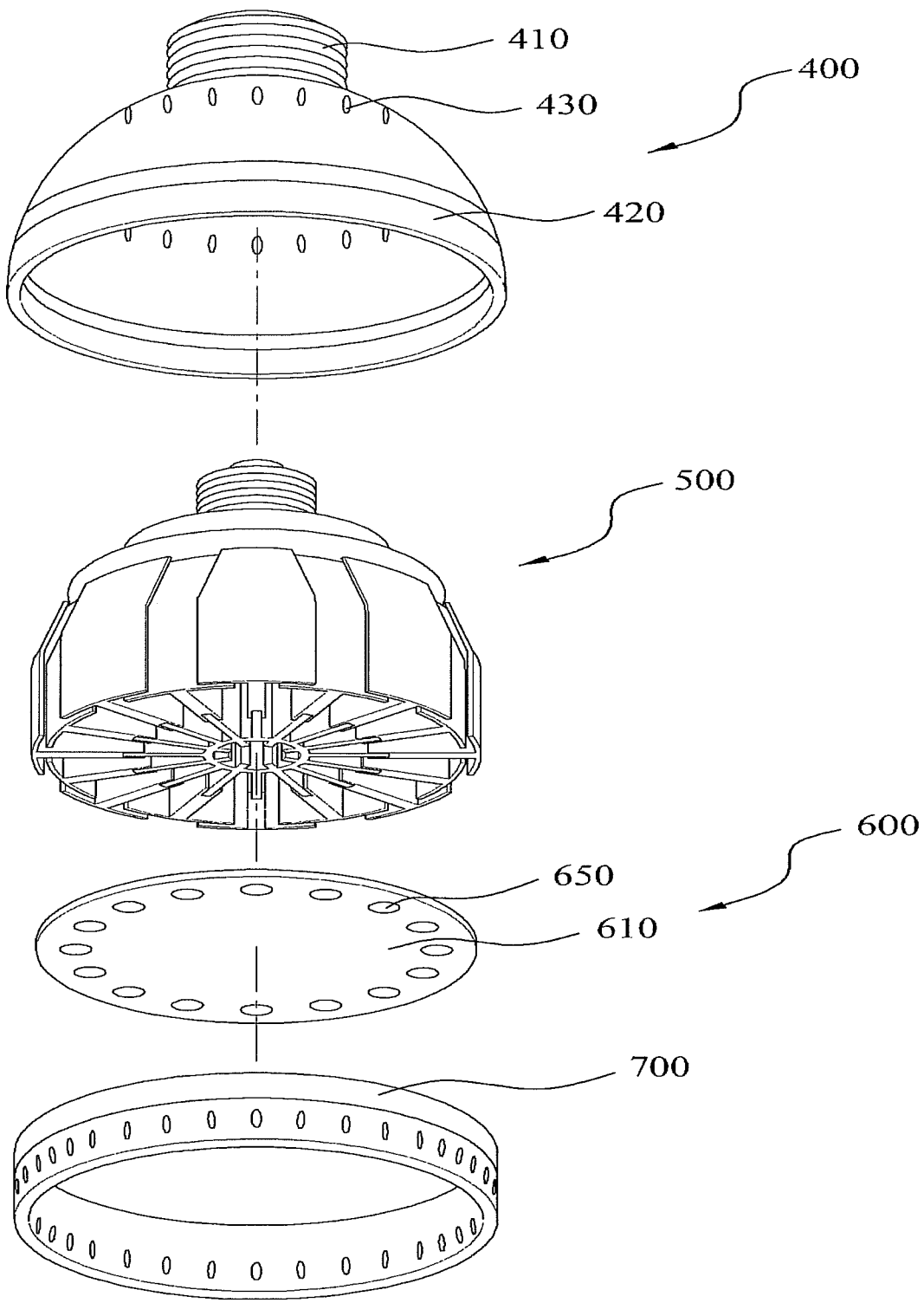
FIG. 4 is an exploded perspective view illustrating a lightening device the light emitting device module according to the above embodiments.

As shown in FIG. 4, the light emitting device package according to the embodiment includes a package body 320, first and second electrode layers 311 and 312 installed in the package body 320, a light emitting device 300 according to the embodiments mentioned above installed in the package body 320, with being electrically connected with the first and second electrode layers 311 and 312, and a filling material 340 surrounding the light emitting device 300.

The package body 320 includes a silicon material, a synthetic material or a metal material. A slope is formed adjacent to the light emitting device 300 and light extraction efficiency may be enhanced accordingly.

The first electrode layer 311 and the second electrode layer 312 are electrically separated from each other, and they provide the light emitting device 300 with an electric power. In addition, the first and second electrode layers 311 and 312 reflect the lights generated from the light emitting device 300, to improve luminous efficiency, and they may exhaust the heat generated from the light emitting device 300 outside.

The light emitting device 300 may be installed on the package body 320 or either of the first and second electrode layers 311 and 312.

The light emitting device 300 may be electrically connected with the first and second electrode layers 311 and 312 by wire-bonding, flip chip-bonding or die-bonding.

The filling material 340 surrounds the light emitting device 300 to protect the light emitting device 300. A phosphor is provided in the filling material 340 and the wavelength of the light emitted from the light emitting device may be changed by the phosphor.

At least one or a plurality of the light emitting devices according to the embodiments described above may be mounted on the light emitting device package, and the embodiment is not limited thereto.

The plurality of the light emitting device packages according to the embodiment may be arrayed on a substrate, and a light guide plate, a prism sheet and a diffuser sheet, which are optical elements, may be arranged on a light passage of the light emitting device package. Such the light emitting device package, the substrate and the optical elements may be functioned as light unit. Another embodiment of the embodiment may present a display device, a pointing device and a lightening system which includes the semiconductor light emitting device or light emitting device package disclosed in the embodiments described above. For example, the lightening system may include a lamp and a streetlamp.

As follows, a lightening device and a backlight unit will be described as an embodiment of a lightening system having the light emitting device mentioned above arranged therein. FIG. 4 is an exploded perspective view illustrating a lightening device according to an embodiment, having the light emitting device module according to the embodiments mentioned above.

The lightening device according to this embodiment includes a light source 600 configured to project a light, a housing 400 where the light source 600 is mounted, a heat radiating part 500 configured to radiate the heat of the light source 600, and a holder 700 configured to connect the light source 600 and the heat radiating part 500 with the housing 400.

The housing 400 includes a socket-secured part 410 secured to an electric socket (not shown) and a body part 420 connected with the socket-secured part 410, with the light source 600 mounted therein. A single air hole 430 may be formed through the body part 420.

The plurality of the air holes 430 may be formed in the body part 420 of the housing 400. The air hole 430 may be configured of a single hole or the plurality of the air holes may be arranged in a radial direction as shown in FIG. 7. Here, various arrangements of the plurality of the air holes may be possible, rather than the radial arrangement thereof.

The light source 600 includes a substrate 610 and a plurality of light emitting device packages 650 arranged on the substrate 610. Here, the substrate 610 may have a predetermined shape which is able to be inserted in an open part of the housing 400 and it may be formed of a material with a high thermal conductivity.

The holder 700 may be provided under the light source and it may include a frame and another air hole. Although not shown in the drawing, optical elements may be provided under the light source 600 and lights emitted from the light emitting device package 650 may be diffused, scattered or collected accordingly.

Figure 5:
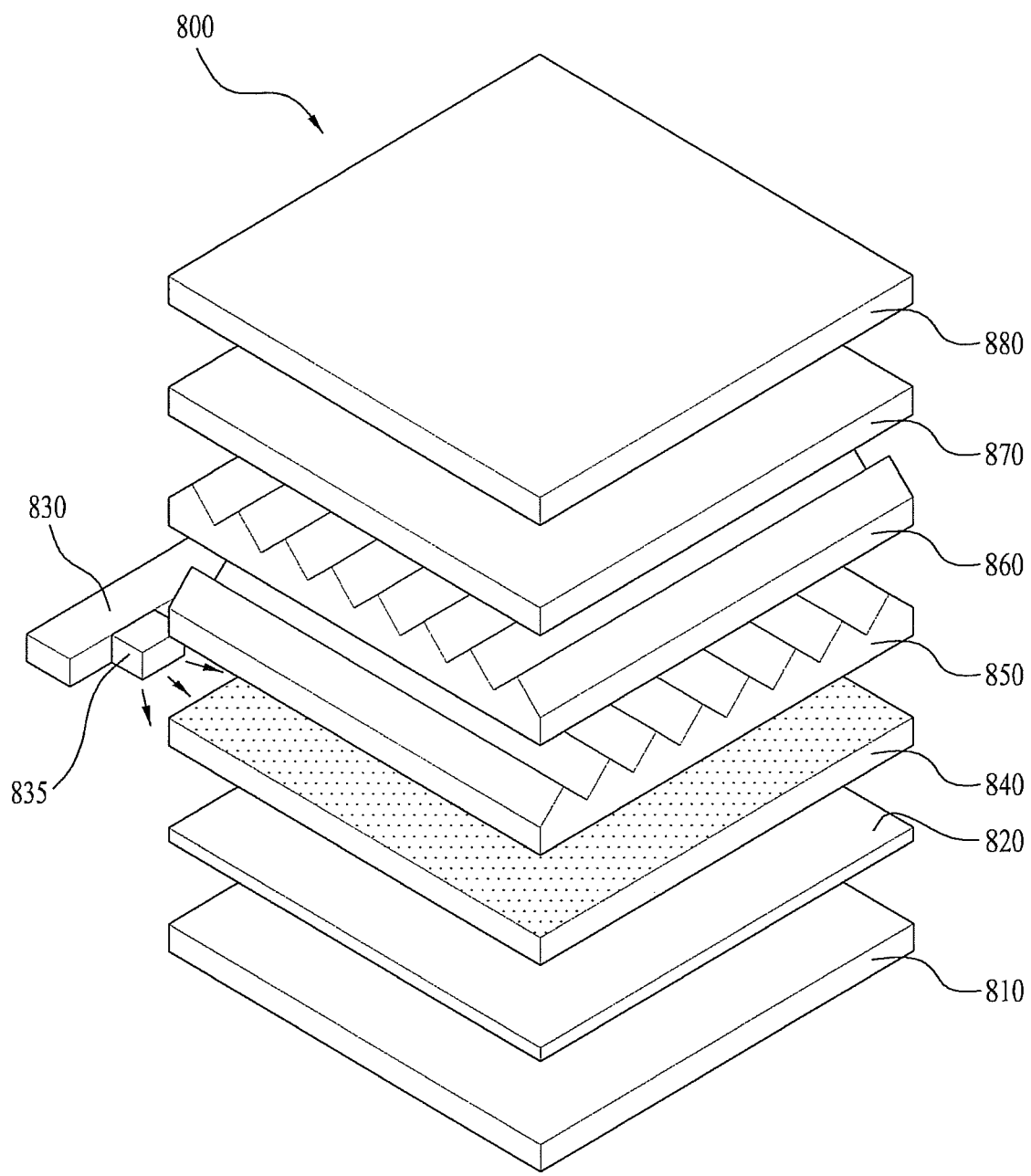
FIG. 5 is a diagram illustrating a display device including the light emitting device according to the above embodiments.

FIG. 5 is a diagram illustrating a display device according to an embodiment which includes the light emitting device package according to the embodiments.

As shown in FIG. 5, a display device 800 according to this embodiment includes light source modules 830 and 835, a reflective plate 820 provided on a bottom cover 820, a light guide plate 840 arranged on a front of the reflective plate 820 to guide a light emitted from the light source modules forwardly, first and second prism sheets 850 and 860 arranged on a front of the light guide plate 840, a panel 870 arranged on a front of the second prism sheet 860, and a color filter 880 arranged on an overall area of the panel 870.

The light source module 830 includes the light emitting device package 835 provided on a substrate 830. The bottom cover 810 may hold inner components of the display device 800. The reflective plate 820 may be an auxiliary component as shown in the drawing or the reflective sheep 820 formed of a material having high reflectivity may be coated on a front surface of the bottom cover 810.

Here, the material which can be used for an ultra-thin film type with a high reflectivity may be used for the reflective plate 820 and polyethylene terephtalate (PET) may be used for the reflective plate 820.

The light guide plate 830 scatters the lights emitted from the light emitting device package to distribute the lights to an overall screen area of a liquid crystal display device uniformly. Because of that, the light guide plate 830 may be formed of a material having a good refractive index and transmissivity, for example, polymethylmethacrylate (PMMA), polycarbonate (PC) and polyethylene (PE). Alternatively, the light guide plate 830 may omitted and air may be employed as optical waveguide.

Alternatively, the light guide plate 840 is omitted and the light reflected from the reflective plate 820 may travel toward the panel directly, which is an air guide type.

The first prism sheet 850 is formed in a surface of a supporting film and it is formed of polymer having transparency and elasticity. The polymer may have prism layers having a plurality of dimensional structures formed repeatedly. Here, the plurality of the patterns may be a stripe type having crests and troughs formed repeatedly, as shown in the drawing.

A direction of the crests and troughs formed in the surface of the supporting film provided in the second prism sheet 860 may be perpendicular to a direction of the crests and troughs formed in the surface of the supporting film provided in the first prism sheet 850. This is because the lights transmitted from both of the light source module and the reflective sheet have to be distributed along a forward direction of the panel 870 uniformly.

Although not shown in the drawing, a protection sheet may be provided on each of the prism sheets and the protection sheet may include a light diffusive element and a binder provided on both surfaces of the supporting film.

The prism layer may be formed of at least one polymer material selected from a group consisted of polyurethane, butadiene-styrene copolymers, polyacrilate, Polymethacrylate, Polymethyl Methacrylate, polyethylene terephthalate elastomer, polyisoprene or polysilicon.

Although not shown in the drawing, a diffuser sheet may be arranged between the light guide plate 840 and the first prism sheet 850. The diffuser sheet may be formed of a polyester/polycarbonate-based material and a light incident from a backlight unit may be refracted and scattered. Because of that, a light projection angle may be broadened as much as possible.

The diffuser sheet includes a supporting layer having a light-diffusing agent and first and second layers formed in a light emitting surface (toward the first prism sheet) and a light incident surface (toward the reflective sheet), respectively, with no light-diffusing agent.

The supporting layer may include a siloxane-based light diffusing agent 0.1~10 weight part, having an average particle size of 1~10 micrometers and an acryl-based light diffusing agent 0.1~10 weight part, having an average particle size of 1~10 micrometers, with respect to a resin 100 weight part which is mixed with methacrylic acid-styrene copolymer and methyl methacrylate-styrene copolymer.

The first and second layers may include an ultraviolet ray absorbent 0.01~1 weight part and an antistic agent 0.0001~10 weight part, with respect to a methyl methacrylate-styrene copolymer resin 100 weight part.

The thickness of the supporting layer provided in the diffuser sheet may be 100~10000 micrometers and the thickness of each of the first and second layers may be 10~1000 micrometers.

According to this embodiment, the diffuser sheet, the first prism sheet 850 and the second prism sheet 860 compose an optical sheet. The optical sheet may be configured of another composition of a micro-lens array, a diffuser sheet and a micro-lens array or of a single prism sheet and a micro-lens array, for example.

The panel 870 may arrange a liquid crystal display thereon and other types of display devices requiring a light source may be provided, rather than the liquid crystal display panel.

In the panel 870, liquid crystal is located between glass bodies and a polarizer is lifted on the glass bodies to uses polarization of lights. The liquid crystal has an in-between property of liquid and solid. Liquid crystal which is an organic molecule is arranged regularly like crystal and a property of the molecule arrangement changed by an external field is used to display an image.

The liquid crystal display used in the display device has an active matrix type which uses a transistor as switch adjusting a voltage supplied to each of pixels.

The color filter 880 is provided on a front surface of the panel 870 and it transmits only red, green blue lights of the light projected from the panel 870 via pixels. Because of that, the image may be presented.

It will be apparent to those skilled in the art that various modifications and variations can be made in the embodiment without departing from the spirit or scope of the embodiment. Thus, it is intended that the present invention covers the modifications and variations of this embodiment provided they come within the scope of the appended claims and their equivalents.

What is claimed is:

1. A light emitting device, comprising:
    a light emitting structure comprising an n-type semiconductor layer, an active layer and a p-type semiconductor layer;
    a contact area disposed in the n-type semiconductor layer, the contact area including oxygen at 5% or more of an atomic ratio or nitrogen at 50% or more of an atomic ratio;
    a first ohmic layer and a first electrode provided on the contact area; and
    a second electrode provided on the p-type semiconductor layer.

2. The light emitting device of claim 1, wherein the contact area of the n-type semiconductor layer is plasma-treated in an atmosphere of at least one of oxygen or nitrogen.

3. The light emitting device of claim 2, wherein the plasma treating is performed according to at least one of Reactive Ion Etching (RIE), Inductively Coupled Plasma (ICP) or Sputtering.

4. The light emitting device of claim 2, wherein the first ohmic layer is formed on the plasma-treated contact area of the n-type semiconductor layer.

5. The light emitting device of claim 2, wherein the first ohmic layer is formed on the contact area of the n-type semiconductor layer after a mask is formed on a plasma-treated surface of the type n-type semiconductor layer.

6. The light emitting device of claim 1, wherein the first ohmic layer is post-annealed after formed on the contact area of the n-type semiconductor layer.

7. The light emitting device of claim 1, wherein the first ohmic layer is formed on the contact area of the n-type semiconductor layer where an oxygen or nitrogen implanting is performed after a photoresist pattern is formed on the n-type semiconductor layer.

8. The light emitting device of claim 1, wherein the first ohmic layer is composed of at least one [a1] material selected from a group consisted of Ti, Cr, Al, V or W.

9. The light emitting device of claim 1, wherein the thickness of the first ohmic layer is 0.5 nanometer to 3.0 micrometers.

10. A light emitting device, comprising:
    a light emitting structure comprising an n-type semiconductor layer comprising a contact area comprising oxygen at 5% or more of an atomic ratio or nitrogen at 50% or more of an atomic ratio, an active layer and p-type semiconductor layer;

a first ohmic layer formed on the contact area of the n-type semiconductor layer;

a first electrode formed on the first ohmic layer;

a passivation layer disposed on at least a portion of a side surface and an upper surface of the light emitting structure; and a light extraction pattern formed on the upper surface of the light emitting structure, and a roughness pattern formed on a bottom surface of the first ohmic layer.

11. The light emitting device of claim 10, wherein the contact area of the n-type semiconductor layer is plasma-treated in an atmosphere of at least one of oxygen or nitrogen.

12. The light emitting device of claim 11, wherein the plasma treating is performed according to at least one of Reactive Ion Etching (RIE), Inductively Coupled Plasma (ICP) or Sputtering.

13. The light emitting device of claim 11, wherein the first ohmic layer is formed on the contact area of the n-type semiconductor layer after a mask is formed on a plasma-treated surface of the n-type semiconductor layer.

14. The light emitting device of claim 10, wherein the contact area of the n-type semiconductor layer is provided with oxygen or nitrogen according to an implanting method.

15. The light emitting device of claim 14, wherein the first ohmic layer is formed on the contact area of the n-type semiconductor layer where an oxygen or nitrogen implanting is performed after a photoresist pattern is formed on the n-type semiconductor layer.

16. The light emitting device of claim 10, wherein the first ohmic layer is formed of at least one material selected from a group consisted of Ti, Cr, Al, V or W.

17. The light emitting device of claim 10, wherein the thickness of the first ohmic layer is 0.5 nanometer to 3.0 micrometers.

18. The light emitting device of claim 10, wherein the passivation layer is disposed apart from the first electrode.

19. A backlight unit comprising:

a light guide plate configured to guide a light emitted from the light emitting device claimed in claim 1; and an optical sheet arranged on a front surface of the light guide plate.

20. A display device comprising:

a circuit board; the light emitting device claimed in claim 1 which is provided on the circuit board;

a light guide plate configured to guide a light emitted from the light emitting device; and a liquid display configured to transmit a light emitted from the light guide plate there through.

* * * * *